US00RE50548E

(19) United States
(12) Reissued Patent
Kim

(10) Patent Number: US RE50,548 E
(45) Date of Reissued Patent: Aug. 19, 2025

(54) ORGANIC LIGHT-EMITTING DISPLAY DEVICE AND MANUFACTURING METHOD OF THE SAME

(71) Applicant: SAMSUNG DISPLAY CO., LTD., Yongin-si (KR)

(72) Inventor: Hyun-Tae Kim, Yongin (KR)

(73) Assignee: SAMSUNG DISPLAY CO., LTD., Yongin-si (KR)

(21) Appl. No.: 17/902,856

(22) Filed: Sep. 4, 2022

Related U.S. Patent Documents

Reissue of:
(64) Patent No.: 9,412,327
Issued: Aug. 9, 2016
Appl. No.: 13/801,845
Filed: Mar. 13, 2013

U.S. Applications:
(63) Continuation of application No. 16/058,519, filed on Aug. 8, 2018, now Pat. No. Re. 49,201, which is an application for the reissue of Pat. No. 9,412,327.

(30) Foreign Application Priority Data

Nov. 13, 2012 (KR) ..... 10-2012-0128371

(51) Int. Cl.
*G09G 3/36* (2006.01)
*H01L 21/02* (2006.01)
(Continued)

(52) U.S. Cl.
CPC ..... *H10D 86/60* (2025.01); *G09G 3/3696* (2013.01); *H01L 21/02063* (2013.01);
(Continued)

(58) Field of Classification Search
CPC ..... G09G 3/3696; H01L 27/1255; H01L 21/02063; H01L 21/76805; H01L 27/1222;
(Continued)

(56) References Cited

U.S. PATENT DOCUMENTS 6,246,179 B1 * 6/2001 Yamada ..... H01L 27/3246 313/498
6,587,086 B1 * 7/2003 Koyama ..... H01L 27/3258 345/76
(Continued)

FOREIGN PATENT DOCUMENTS

JP 3922374 3/2007
JP 3922374 B2 3/2007
(Continued)

OTHER PUBLICATIONS

Korean Patent 10-2012-0128371 Written Opinion Apr. 30, 2019 (Year: 2019).*

*Primary Examiner* — Luke S Wassum
(74) *Attorney, Agent, or Firm* — F. CHAU & ASSOCIATES, LLC

(57) ABSTRACT

An organic light-emitting display device and a related manufacturing method of the organic light-emitting display device are disclosed. In one aspect, the organic light-emitting display device includes a plurality of pixels which are formed between a plurality of scan lines and a plurality of data signal lines. It also includes a plurality of initialization voltage lines which are formed in parallel with the plurality of scan lines and are shared between two adjacent pixels of a row to supply an initialization voltage to the two adjacent pixels. It also includes a driving voltage line which supplies a driving voltage to the plurality of pixels and includes a first voltage line formed in a vertical direction and a second voltage line that is connected between the two adjacent pixels and formed in a horizontal direction.

18 Claims, 13 Drawing Sheets

(51) Int. Cl.

| | |
|---|---|
| ***H01L 21/768*** | (2006.01) |
| ***H01L 27/32*** | (2006.01) |
| ***H10D 86/40*** | (2025.01) |
| ***H10D 86/60*** | (2025.01) |
| ***H10K 59/121*** | (2023.01) |
| ***H10K 59/131*** | (2023.01) |

(52) U.S. Cl.
CPC ..... *H01L 21/76805* (2013.01); *H10D 86/421* (2025.01); *H10D 86/441* (2025.01); *H10D 86/481* (2025.01); *H10K 59/121* (2023.02); *H10K 59/131* (2023.02); *G09G 2300/0809* (2013.01)

(58) Field of Classification Search
CPC ... H01L 27/124; H10K 59/121; H10K 59/131
See application file for complete search history.

(56) References Cited

U.S. PATENT DOCUMENTS 7,339,559 B2 3/2008 Yokoyama
7,394,446 B2 7/2008 Park
7,446,741 B2 * 11/2008 Park ..... H01L 27/3251 345/76
7,495,733 B2 * 2/2009 Lee ..... G02F 1/134363 349/141
7,535,444 B2 5/2009 Kim
7,692,191 B2 * 4/2010 Kwak ..... H10K 50/818 438/151
7,830,084 B2 * 11/2010 Shirasaki ..... G09G 3/325 257/40
8,547,315 B2 * 10/2013 Yoshida ..... H01L 21/288 257/207
8,552,655 B2 10/2013 Ono
9,165,993 B2 * 10/2015 Kim ..... H01L 27/1255
9,287,528 B2 * 3/2016 Kim ..... H01L 29/78696
9,324,777 B2 * 4/2016 Kang ..... H10K 59/131
9,412,327 B2 8/2016 Kim
10,170,533 B2 1/2019 Iida et al.
2003/0067458 A1 * 4/2003 Anzai ..... G09G 3/3225 345/204
2003/0117564 A1 * 6/2003 Park ..... G02V 1/13452 349/149
2004/0115989 A1 6/2004 Matsueda et al.
2004/0130514 A1 * 7/2004 Yokoyama ..... G09G 3/3225 345/76
2005/0140306 A1 6/2005 Park
2005/0149682 A1 * 7/2005 Kim ..... G06F 3/0611 711/161
2005/0151898 A1 * 7/2005 Yi ..... G02F 1/1362 349/106
2007/0120188 A1 5/2007 Kubota et al.
2010/0019996 A1 * 1/2010 You ..... H01L 27/1214 345/76
2010/0110623 A1 * 5/2010 Koyama ..... H01L 27/1248 361/679.01
2010/0155734 A1 * 6/2010 Lee ..... G02F 1/136259 257/59
2011/0122355 A1 * 5/2011 Matsumuro ..... G02F 1/136227 349/143
2012/0026144 A1 * 2/2012 Kang ..... H10K 59/131 345/76
2012/0056904 A1 * 3/2012 Lhee ..... G09G 3/3233 345/690
2014/0132584 A1 5/2014 Kim

FOREIGN PATENT DOCUMENTS

| | | |
|---|---|---|
| JP | 2009-181014 | 8/2009 |
| KR | 10-0517251 | 9/2005 |
| KR | 10-0517251 B1 | 9/2005 |
| KR | 10-0573156 | 4/2006 |
| KR | 10-0573156 B1 | 4/2006 |
| KR | 10-0642491 | 10/2006 |
| KR | 10-0642491 B1 | 10/2006 |
| KR | 10-2012-0010824 | 2/2012 |
| KR | 10-2012-0022812 | 3/2012 |

* cited by examiner

ORGANIC LIGHT-EMITTING DISPLAY DEVICE AND MANUFACTURING METHOD OF THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application claims the benefit of Korean Patent Application No. 10-2012-0128371, filed on Nov. 13, 2012, in the Korean Intellectual Property Office, the disclosure of which is incorporated herein in its entirety by reference.]

*Notice: More than one reissue application has been filed for the reissue of U.S. Pat. No. 9,412,327. The reissue applications are application Ser. No. 17/902,856 (the present application); and application Ser. No. 16/058,519.*

*This application is a continuation reissue of U.S. application Ser. No. 16/058,519 filed on Aug. 8, 2018, now U.S. Reissue Pat. No. RE49,201, issued on Aug. 17, 2022, which is a reissue application of U.S. application Ser. No. 13/801,845, filed on Mar. 13, 2013, now U.S. Pat. No. 9,412,327, issued on Aug. 9, 2016, which claims priority under 35 U.S.C. §119(a)-(d) to Korean Patent Application No. 10-2012-0128371, filed on Nov. 13, 2012, the disclosures of which are incorporated by reference herein in their entireties. This application is also a reissue of U.S. application Ser. No. 31/801,845, filed on Mar. 13, 2013, now U.S. Pat. No. 9,412,327, issued on Aug. 9, 2016.*

BACKGROUND

1. Field

The disclosed technology relates to an organic light-emitting display device and a manufacturing method of the same.

2. Description of the Related Technology

A display device displays an image, and an organic light-emitting diode (OLED) display has particularly generated interest for use in commercializing a variety of products.

An OLED display has a self-emission characteristic by which, differently from a liquid crystal display (LCD), the OLED display does not need an additional light source such as a backlight. Therefore, the thickness and weight of an OLED display are comparatively reduced. Also, OLED displays have high-quality characteristics of low power consumption, high luminance, and high response speeds, and so on.

A panel of the OLED display includes a plurality of pixels which are arranged in an N×M matrix, and a data signal Dm, a scan signal Sn, and a power supply voltage ELVDD are selectively applied to each of the pixels in the matrix. The power supply voltage ELVDD may be commonly supplied to all pixel circuits. Unfortunately, wires for respectively supplying the power supply voltage ELVDD to the pixels have parasitic resistance components. If the power supply voltage ELVDD is supplied through the wires, a voltage drop occurs due to the parasitic resistance components.

SUMMARY OF CERTAIN INVENTIVE ASPECTS

In some aspects, the disclosed technology relates to a display device in which wires for supplying a power supply voltage ELVDD are formed in a mesh structure to prevent a voltage drop of the power supply voltage ELVDD and minimize leakage current.

According to an aspect of the disclosed technology, there is provided an organic light-emitting display device comprising: a plurality of pixels which are formed between a plurality of scan lines and a plurality of data lines; a plurality of initialization voltage lines which are formed in parallel with the plurality of scan lines and are shared between two adjacent pixels of a row to supply an initialization voltage to the two adjacent pixels; and a driving voltage line which supplies a driving voltage to the plurality of pixels and comprises a first volatage line formed in a vertical direction and a second voltage line that is connected between the two adjacent pixels and formed in a horizontal direction.

In some embodiments, the driving voltage line is formed in a mesh structure in which the first and second voltage lines are connected to each other. The first voltage lines of the two adjacent pixels are spaced a distance apart from each other so as to parallel each other. The driving voltage line is formed on a layer on which the plurality of data lines are formed.

In some embodiments, the initialization voltage line is formed to be parallel with the second voltage. The initialization voltage line is formed on a layer on which pixel electrodes are formed. The initialization voltage line is electrically connected to initialization thin film transistors (TFTs) of the two adjacent pixels through a via hole commonly formed in the two adjacent pixels.

According to another aspect of the disclosed technology, there is provided an organic light-emitting display device comprising: active layers which have a connection area connected to each other between two adjacent pixels in a row; a first gate insulating layer, a second gate insulating layer, and an interlayer insulating layer which are sequentially formed on the active layers; a contact holes which is formed in the first and second gate insulating layers and the interlayer insulating layer and exposes the connection area of the active layers; a driving voltage line which is formed on the interlayer insulating layer; a contact metal which contacts the contact hole on the interlayer insulating layer; a protective layer which is formed on the driving voltage line and the contact metal; a via hole which is formed in protective layer and exposes part of the contact metals and are formed in the protective layer; and an initialization voltage line which is connected to the active layers through the via hole.

In some embodiments, the driving voltage line comprises a first voltage line formed in a vertical direction and a second voltage connected between the two adjacent pixels in a horizontal direction. The driving voltage line is formed in a mesh structure in which the first and second voltage lines are connected to each other. The first voltage lines are respectively formed in the two adjacent pixels and spaced a distance apart from each other so as to parallel each other. The driving voltage line is formed on a layer on which the plurality of data lines are formed.

In some embodiments, the initialization voltage line is disposed to be parallel with the second voltage line. The initialization voltage line is formed on a layer on which pixel electrodes are formed.

In some embodiments, the active layers may be symmetrical to each other between the two adjacent pixels based on the connection area. Parts of the active layers are formed to be orthogonal to the second voltage line and overlap with the second voltage line.

According to another aspect of the disclosed technology, there is provided a method of manufacturing an organic light-emitting display device, comprising: forming active layers that have a connection area connected between two adjacent pixels of a row on a substrate; sequentially forming first and second gate insulating layers and an interlayer insulating layer on the active layers; forming a contact hole in the first and second gate insulating layers and the interlayer insulating layer to expose a part of the connection area of the active layers; forming a contact metal contacting a driving voltage line and the contact holes on the interlayer insulating layer; forming a protective layer on the driving voltage line and the contact metal; forming a via hole in the protective layer to expose part of the contact metal; and forming an initialization voltage line that is connected to the active layers through the via hole.

In some embodiments, the driving voltage line comprises a first voltage line disposed in a vertical direction and a second voltage line that is connected between the two adjacent pixels in a horizontal direction, and is formed in a mesh structure in which the first and second voltage lines are connected to each other.

In some embodiments, the initialization voltage line is formed to be parallel with the second voltage line.

In some embodiments, the active layers are symmetrical to each other between the two adjacent pixels based on the connection area, and parts of the active layers are disposed to be orthogonal to the second voltage line and overlap with the second voltage line.

BRIEF DESCRIPTION OF THE DRAWINGS

The above and other features and advantages of the disclosed technology will become more apparent by describing in detail exemplary embodiments thereof with reference to the attached drawings in which.

DETAILED DESCRIPTION OF CERTAIN INVENTIVE EMBODIMENTS

Figure 1:
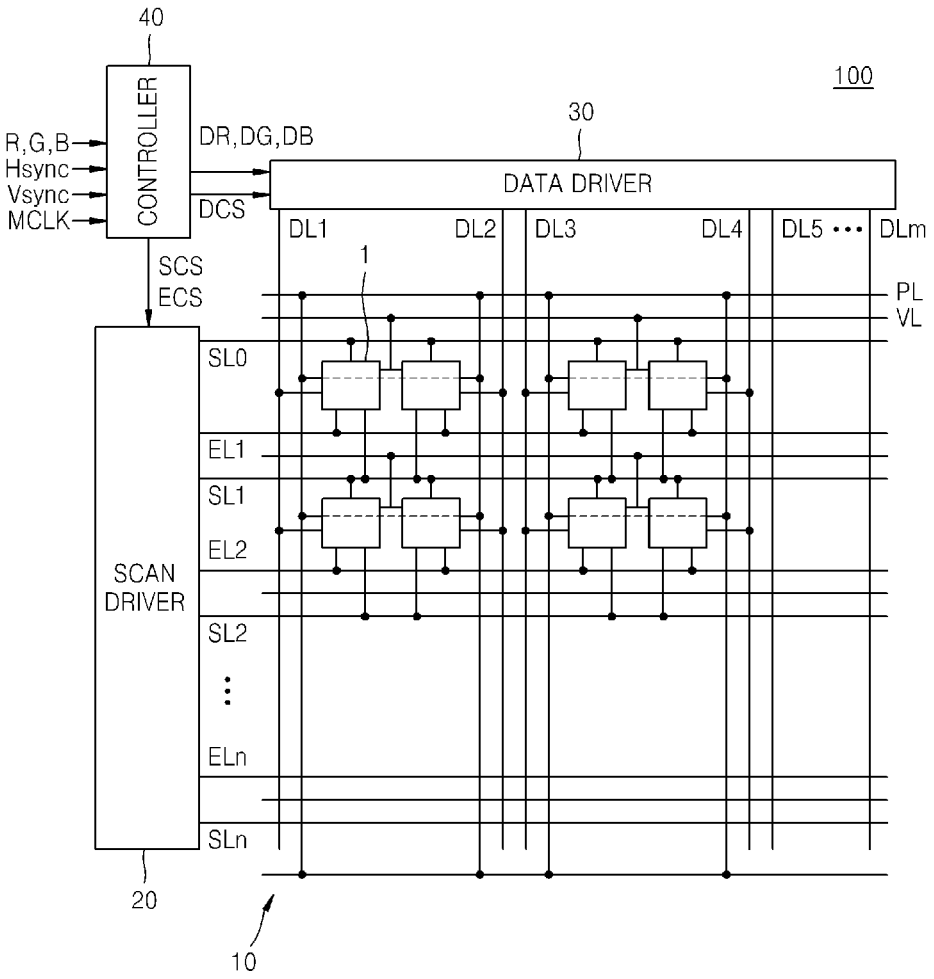
FIG. 1 is a schematic block diagram illustrating a display device according to an embodiment of the disclosed technology.

The disclosed technology will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the thicknesses of layers and regions are exaggerated for clarity.

It will also be understood that when a layer is referred to as being "on" another layer or substrate, it can be directly on the other layer or substrate, or intervening layers may also be present.

It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a schematic block diagram illustrating a display device 100 according to an embodiment of the disclosed technology.

Referring to FIG. 1, the display device 100 includes a display unit 10 including a plurality of pixels, a scan driver 20, a data driver 30, and a controller 40. The scan driver 20, the data driver 30, and the controller 40 may be respectively formed on separate semiconductor chips or may be integrated on one semiconductor chip. The scan driver 20 and the display unit 10 are often formed on the same substrate.

The display unit 10 is located at intersections of a plurality of scan lines SL0 through SLn, a plurality of data signal lines DL1 through DLm, and a plurality of emission control lines EL1 through ELn to include the pixels that are arranged in a matrix form.

Each of the pixels is connected to two of the plurality of scan lines SL0 through SLn. Each of the pixels is also connected to a scan line corresponding to the corresponding pixel and a scan line of a previous pixel line in FIG. 1 but is not limited thereto. For example, each of the pixels is connected to two scan lines and the two adjacent pixels arranged in column lines do not share one scan line. In this case, pixels in first row line are connected to a first scan line SL0 and a second scan line SL1, and pixels in second row line are connected to a third scan line SL2 and a fourth scan line SL3.

Also, each of the pixels is connected to one of the plurality of data signal lines DL1 through DLm and one of the plurality of emission control lines EL1 through ELn.

Each of the pixels is connected to one of a plurality of initialization voltage lines VL for supplying an initialization voltage and one of a plurality of driving voltage lines PL) for supplying a first power supply voltage ELVDD.

Two adjacent pixels are symmetrical to one another in a direction extending across the scan lines SL0 through SLn, i.e., a row line (or a pixel line, a width direction, or a horizontal direction). Two adjacent pixels having symmetrical structures share the initialization voltage lines VL arranged in a row line. The driving voltage lines PL that are arranged in column lines of the two adjacent pixels having the symmetrical structures are kept a predetermined distance from each other in parallel. The driving voltage lines PL that are arranged in column lines are connected to each other through the driving voltage lines PL that are arranged in row lines to form a mesh structure.

The scan driver 20 generates two corresponding scan signals and transmits the two corresponding scan signals to the pixels through the scan lines SL0 through SLn. In other words, the scan driver 20 transmits a first scan signal through a scan line corresponding to a row line in which each pixel is included and transmits a second scan signal through a scan line corresponding to a previous row line of the corresponding row line. For example, the scan driver 20 transmits a first scan signal Sn to a pixel arranged in an $m^{th}$ column line of an $n^{th}$ row line through an nth scan line SLn and transmits a second scan signal Sn−1 to the pixel through an $n-1^{th}$ scan line SLn−1. The scan driver 20 generates emission control signals EM1 through EMn and respectively transmits the emission control signals EM1 through EMn to the pixels through the plurality of emission control lines EL1 through ELn. Scan signals $S_0$ through Sn and emission control signals EM1 through EMn are generated by the same scan driver 20 in the present embodiment but are not limited thereto. The display device 100 may further include an emission control driver by which the emission control signals are generated.

The data driver 30 respectively transmits data signals D1 through Dm to the pixels through the data signal lines DL1 through DLm.

The controller 40 converts a plurality of image signals R (red), G (green), and B (blue) transmitted from an external source into a plurality of image data signals DR, DG, and DB and transmits the image data signals DR, DG, and DB to the data driver 30. The controller 40 also receives a vertical sync signal Vsync, a horizontal sync signal Hsync, and a clock signal MCLK to generate control signals for controlling driving of the scan driver 20 and the data driver 30 and transmits the control signals to the scan driver 20 and the data driver 30. In other words, the controller 40 generates and transmits a scan driving control signal SCS and an emission driving control signal ECS for controlling the scan driver 20 and a data driving control signal DCS for controlling the data driver 30.

Each pixel respectively emits light having a predetermined luminance through a driving current Ioled supplied to an organic light-emitting diode (OLED) according to the data signals D1 through DM transmitted through the plurality of data signal lines DL1 through DLm.

Figure 2:
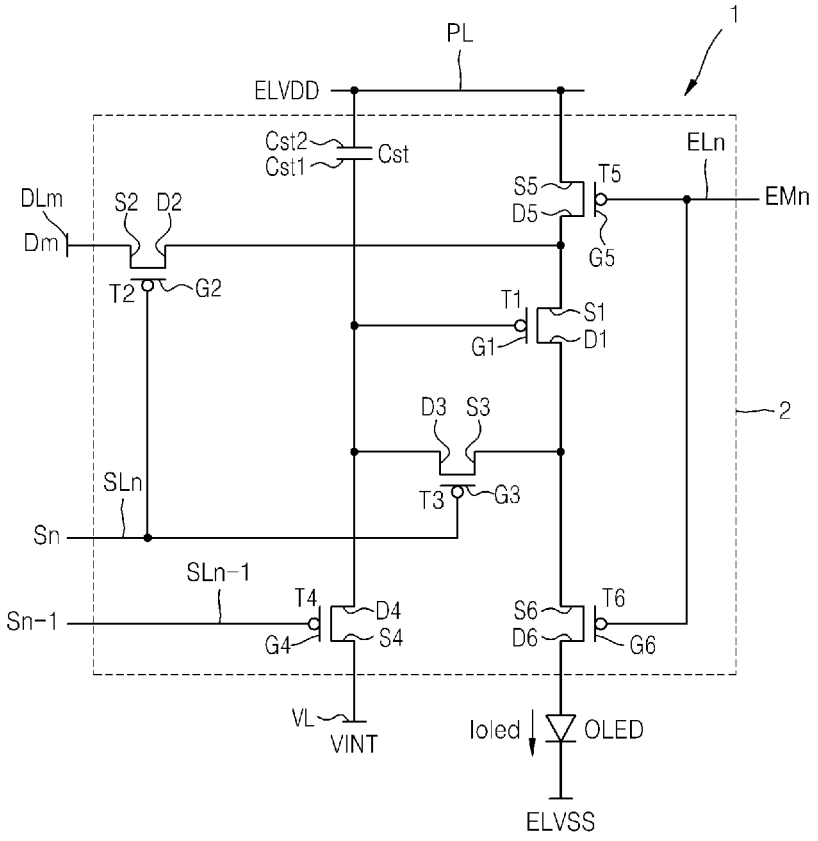
FIG. 2 is an equivalent circuit diagram of one pixel of a display device, according to an embodiment of the disclosed technology.
Figure 3:
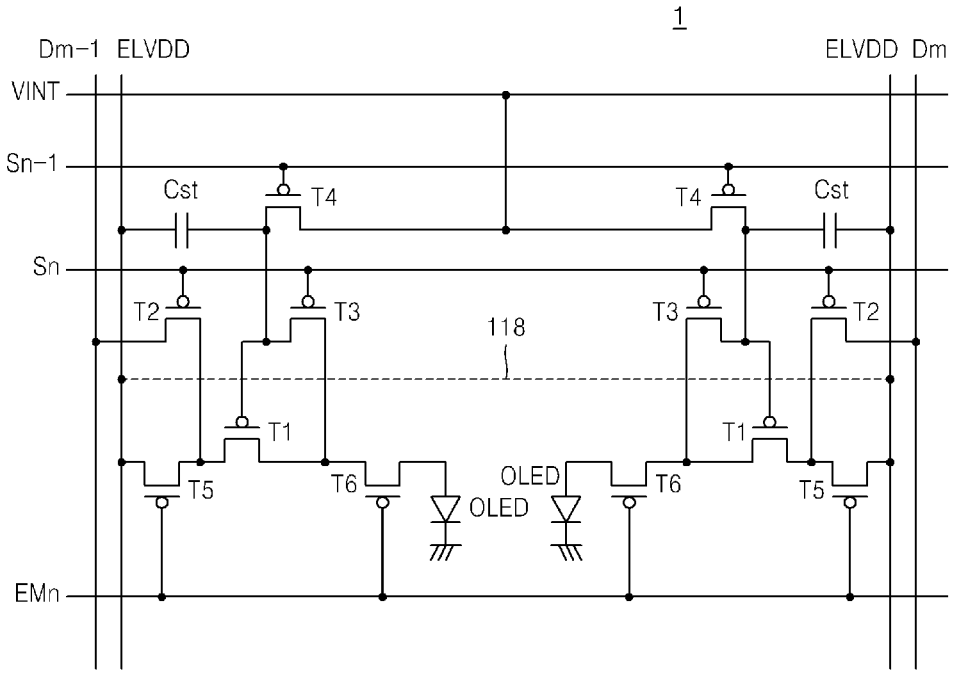
FIG. 3 is a schematic circuit diagram of two adjacent pixels of a display device, according to an embodiment of the disclosed technology.

FIG. 2 is an equivalent circuit diagram of one pixel 1 of the display device, according to an embodiment of the disclosed technology. FIG. 3 is a schematic circuit diagram of two adjacent pixels 1 of a display device, according to an embodiment of the disclosed technology.

The pixel 1 shown in FIGS. 2 and 3 is one of a plurality of pixels included in an $n^{th}$ row line and is connected to a scan line SLn corresponding to the $n^{th}$ row line and a scan line SLn−1 corresponding to an $n-1^{th}$ row line before the $n^{th}$ row line.

The pixel 1 of the display device according to an embodiment of the disclosed technology includes a pixel circuit 2 including a plurality of thin film transistors (TFTs), and a storage capacitor Cst. The pixel 1 also includes an OLED which receives a driving current from the pixel circuit 2 to emit light.

The TFTs include a driving TFT T1, a switching TFT T2, a compensation TFT T3, a initialization TFT T4, a first emission control TFT T5, and a second emission control TFT T6.

The pixel 1 includes a first scan line SLn, a second scan line SLn−1, an emission control line ELn, a data signal line DLm, a driving voltage line PL, and an initialization voltage line VL. The first scan line SLn transmits a first scan signal Sn to the switching TFT 2 and the compensation TFT T3. The second scan line SLn−1 transmits a second scan signal Sn−1 as a previous scan signal to the initialization TFT T4. The emission control line ELn transmits an emission control signal EMn to the first and second emission control TFTs T5 and T6. The data signal line DLm intersects with the first scan line SLn and transmits a data signal Dm. The driving voltage line PL transmits a first power supply voltage ELVDD and is substantially parallel with the data signal line DLm. The initialization voltage line VL transmits an initialization voltage VINT for initializing the driving TFT T1 and is substantially parallel with the second scan line SLn−1.

A gate electrode G1 of the driving TFT T1 is connected to a first electrode Cst1 of the storage capacitor Cst. A source electrode S1 of the driving TFT T1 is connected to the driving voltage line PL through the first emission control TFT T5. A drain electrode D1 of the driving TFT T1 is electrically connected to an anode electrode of the OLED through the second emission control TFT T6. The driving TFT T1 receives the data signal Dm according to a switching operation of the switching TFT T2 to supply the driving current Ioled to the OLED.

A gate electrode G2 of the switching TFT T2 is connected to the first scan line SLn. A source electrode S2 of the switching TFT T2 is connected to the data signal line DLm. A drain electrode D2 of the switching TFT T2 is connected to the source electrode S1 of the driving TFT T1 and is connected to the driving voltage line PL through the first emission control TFT T5. The switching TFT T2 is turned on according to the first scan signal Sn received through the first scan line SLn to perform a switching operation which is to transmit the data signal Dm transmitted to the data signal line DLm to the source electrode S1 of the driving TFT T1.

A gate electrode G3 of the compensation TFT T3 is connected to the first scan line SLn. A source electrode S3 of the compensation TFT T3 is connected to the drain electrode D1 of the driving TFT T1 and is connected to the anode electrode of the OLED through the second emission control TFT T6. A drain electrode D3 of the compensation TFT T3 is connected to the first electrode Cst1 of the storage capacitor Cst, a drain electrode D4 of the initialization TFT T4, and the gate electrode G1 of the driving TFT T1. The compensation TFT T3 is turned on according to the first scan signal Sn received through the first scan line SLn to connect the gate electrode G1 and the drain electrode D1 of the driving TFT T1 to each other for diode-connection of the driving TFT T1.

A gate electrode G4 of the initialization TFT T4 is connected to the second scan line SLn−1. A source electrode S4 of the initialization TFT T4 is connected to the initialization voltage line VL. A drain electrode D4 of the initialization TFT T4 is connected to the first electrode Cst1 of the storage capacitor Cst, the drain electrode D3 of the compensation TFT T3, and the gate electrode G1 of the driving TFT T1. The initialization TFT T4 is turned on according to the second scan signal Sn−1 received through the second scan line SLn−1 to transmit the initialization voltage VINT to the gate electrode G1 of the driving TFT T1 in order to perform an initialization operation of initializing a voltage of the gate electrode G1 of the driving TFT T1.

A gate electrode G5 of the first emission control TFT T5 is connected to an emission control line ELn. A source electrode S5 of the first emission control TFT T5 is connected to the driving voltage line PL. A drain electrode D5 of the first emission control TFT T5 is connected to the source electrode S1 of the driving TFT T1 and the drain electrode D2 of the switching TFT T2.

A gate electrode G6 of the second emission control TFT T6 is connected to the emission control line ELn. A source electrode S6 of the second emission control TFT T6 is connected to the drain electrode D1 of the driving TFT T1 and the source electrode S3 of the compensation TFT T3. A drain electrode D6 of the second emission control TFT T6 is electrically connected to the anode electrode of the OLED. The first and second emission control TFTs T5 and T6 are simultaneously turned on according to the emission control signal EMn received through the emission control line ELn to transmit the first power supply voltage ELVDD to the OLED in order to allow the driving current Ioled to flow in the OLED.

A second electrode Cst2 of the storage capacitor Cst is connected to the driving voltage line PL. The first electrode Cst1 of the storage capacitor Cst is connected to the gate electrode G1 of the driving TFT T1, the drain electrode D3 of the compensation TFT T3, and the drain electrode D4 of the initialization TFT T4.

A cathode electrode of the OLED is connected to a second power supply voltage ELVSS. The OLED receives the driving current Ioled from the driving TFT T1 to emit light in order to display an image. The first power supply voltage ELVDD may be a predetermined high level voltage, and the second power supply voltage ELVSS may be a voltage lower than the first power supply voltage ELVDD or a ground voltage.

Referring to FIG. 3, an initialization voltage line VL supplying an initialization voltage VINT, a first scan line SLn supplying a first scan signal Sn, a second scan line SLn−1 supplying a second scan line Sn−1, and an emission control line ELn supplying an emission control signal EMn are formed in parallel in a horizontal direction. Data signal lines DLm−1 and DLm and a driving voltage line PL are formed in parallel in a vertical direction orthogonal to the horizontal direction.

Two adjacent pixels 1 share the initialization voltage line VL and are formed so that the data signal lines DLm−1 and DLm and the driving voltage lines PL keep a predetermined distance from each other to face each other. The adjacent driving voltage lines PL are connected to each other through a connection line 118 formed in the horizontal direction, thus creating a mesh structure, in order to supply power in the horizontal and vertical directions. Therefore, the area of a power supply line is further extended to reduce the voltage drop caused by resistance of the line.

In the present embodiment, the two adjacent pixels 1 may share the initialization voltage line VL to be symmetrical to each other. Therefore, the data signal line DLm−1 and the driving voltage line PL in the vertical direction of the left pixel 1 are formed at the left side of the left pixel 1. The data signal line DLm and the driving voltage line PL in the vertical direction of the right pixel 1 are formed at the right side of the right pixel 1. As a result, another signal line on the same layer is not formed between the driving voltage lines PL of the left and right pixels 1 in the vertical direction, and thus the two driving voltage lines PL in the vertical direction are connected to each other through the connection line 118 formed on the same layer as the driving voltage lines PL in the vertical direction.

Figure 4:
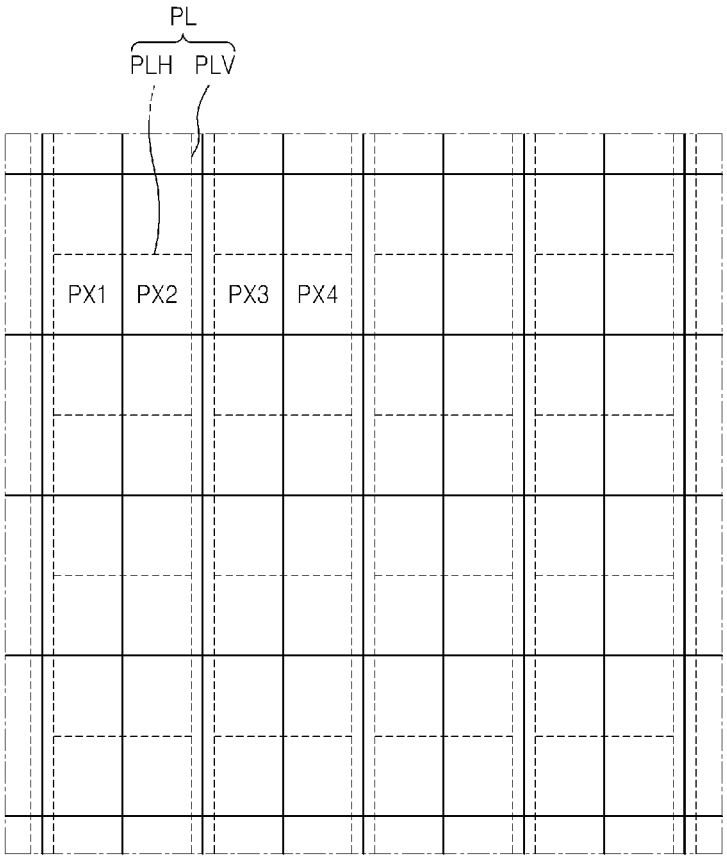
FIG. 4 is a view illustrating a mesh structure of a driving power line PL of a display device, according to an embodiment of the disclosed technology.

FIG. 4 is a view illustrating a mesh structure of a driving voltage line PL of a display device, according to an embodiment of the disclosed technology.

Referring to FIG. 4, the driving voltage line PL of the display device includes vertical driving voltage lines PLV extending in a vertical direction in column lines and horizontal driving voltage lines PLH each connecting two adjacent pixels (e.g., first and second pixels PX1 and PX2) in row lines. The driving voltage line PL is also formed in a mesh structure. The horizontal driving voltage lines PLH are formed by a connection line 118 connecting two vertical driving voltage lines PLV. The connection line 118 may extend from the vertical driving voltage lines PLV to form a single body with the vertical driving voltage lines PLV. Or the connection line 118 may be formed as a separate line and connected to the vertical driving voltage lines PLV directly or through contact hole.

The horizontal driving voltage lines PLH are arranged at appropriate position according to arrangements of a pixel circuit. The vertical driving voltage lines PLV of two pixels (e.g., the first and second pixels PX1 and PX2) sharing the horizontal driving voltage line PLH keep a distance from each other to face each other. Vertical driving voltage lines PLV of two adjacent pixels (e.g. second and third pixels PX2 and PX3) which do not share the horizontal driving voltage line PLH are adjacent to each other with the data line in between. That is, the horizontal driving voltage line PLH is not formed between the two adjacent pixels (e.g., the second and third pixels PX2 and PX3) of which the vertical driving voltage lines PLV are adjacent to each other.

Figure 7:
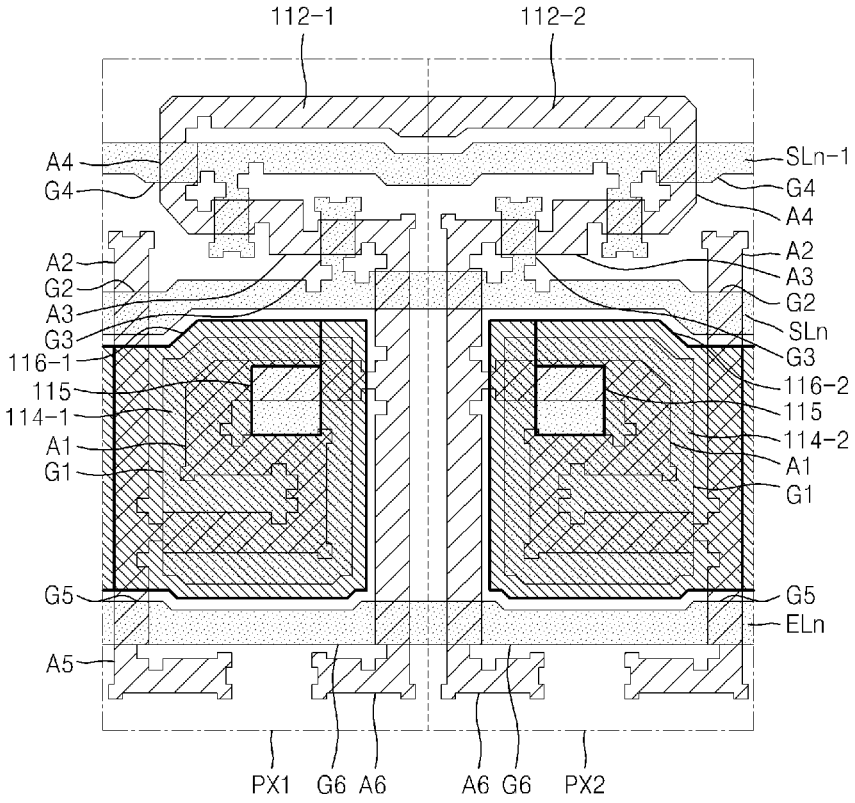
Figure 8:
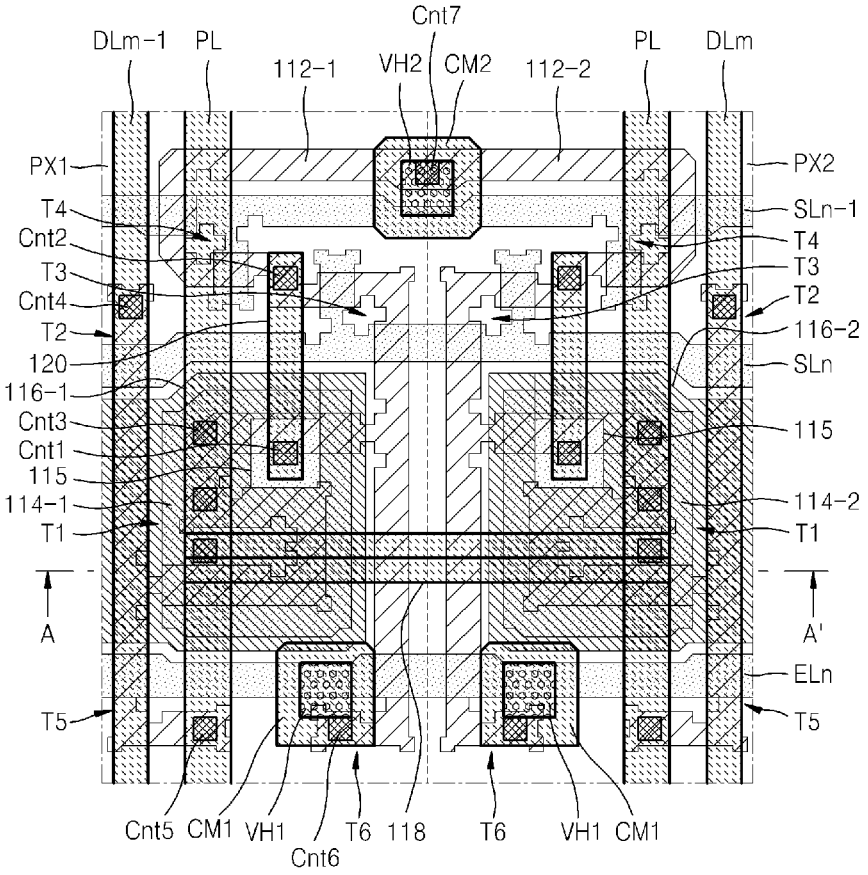
Figure 9:
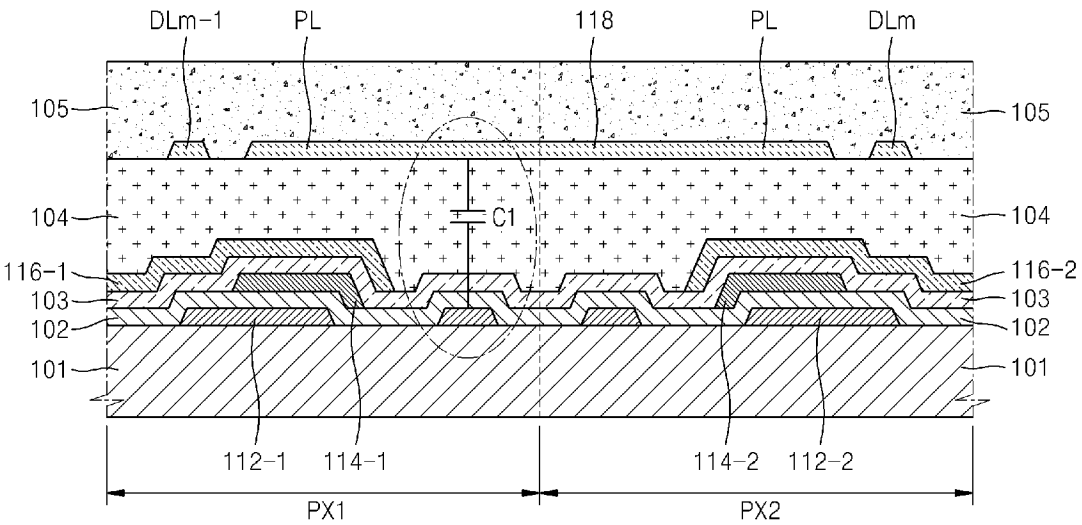

FIGS. 5 through 10 are views illustrating a method of forming pixel circuits of two adjacent pixels, according to an embodiment of the disclosed technology. FIG. 9 is a cross-sectional view taken along line A-A' of FIG. 8.

Figure 5:
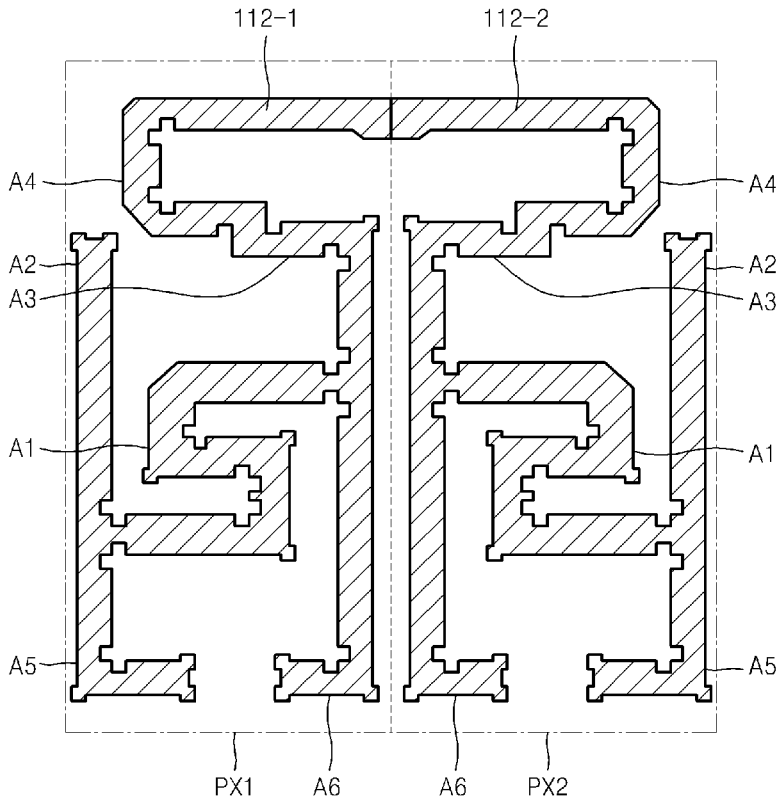
FIGS. 5 through 10 are views illustrating a method of forming pixel circuits of two adjacent pixels, according to an embodiment of the disclosed technology.

Referring to FIGS. 5 and 9, first and second active layers 112-1 and 112-2 of first and second pixels PX1 and PX2 are formed on a substrate 101. The first active layer 112-1 of the first pixel PX1 and the second active layer 112-2 of the second pixel PX2 are connected to each other. The first and second active layers 112-1 and 112-2 are symmetrical to each other based on an active area connection between the first and second pixels PX1 and PX2. The active area connection between the first and second pixels PX1 and PX2 is connected to an initialization voltage line VL later.

The first and second active layers 112-1 and 112-2 may be formed as amorphous silicon layers, polycrystalline silicon layers, or oxide semiconductor layers such as G-I-Z layers [(In2O3)a(Ga2O3)b(ZnO)c layer] (wherein a, b, and c are real numbers satisfying a condition of a≥0, b≥0, and c>0). According to certain embodiments, the first and second active layers 112-1 and 112-2 are connected to each other and thus transmit an initialization voltage VINT applied to the initialization voltage line VL to the first and second pixels PX1 and PX2.

TFTs of a pixel circuit are formed along the first and second active layers 112-1 and 112-2. Active layers A1, A2, A3, A4, A5, and A6 of a driving TFT T1, a switching TFT T2, a compensation TFT T3, an initialization TFT T4, a first emission control TFT T5, and a second emission control TFT T6 are formed on each of the first and second active layers 112-1 and 112-2. An active layer of each TFT includes a channel area which is not doped with impurities, and source and drain areas which are formed by doping both sides of the channel area with impurities. Here, the impurities vary according to a type of a TFT and may be N-type or P-type impurities.

The first and second active layers 112-1 and 112-2 are curved in various shapes. In particular, each of the active layers A1 of the driving TFTs T1 has a plurality of curved parts having zigzag shapes, "S" shapes, or "ㄹ" shapes. Therefore, the channel areas are formed to be long, and thus, the driving range of the gate voltage widens. As a result, widening of the driving range of the gate voltage changes the intensity of the gate voltage, and thus, gradations of light emitted from OLEDs are further precisely controlled. Thereby the resolution and image quality of the organic light-emitting display device are improved.

Figure 6:
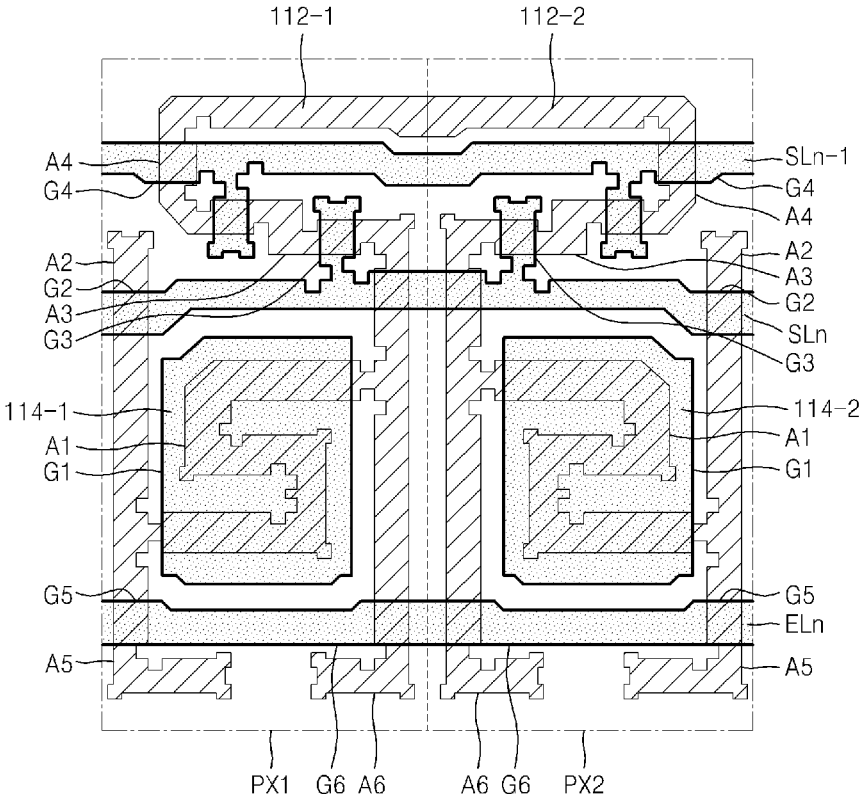

Referring to FIGS. 6 and 9, a first gate insulating layer 102 is formed on the substrate 101 on which the first and second active layers 112-1 and 112-2 are formed. The first gate insulating layer 102 may be formed of an organic insulating material, an inorganic insulting material, or in a multilayer structure in which organic insulating materials alternate with inorganic insulating materials.

A first gate lines are formed on the first gate insulating layer 102. The first gate lines may include a first scan line SLn, a second scan line SLn−1, an emission control line ELn, and first capacitor electrodes 114-1 and 114-2. The first gate lines may include at least one metal material in the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and preferably, a low resistance metal material such as aluminum (Al), copper (Cu), or the like.

The first capacitor electrodes 114-1 and 114-2 operate as gate electrodes G1 of the driving TFTs T1. The first capacitor electrodes 114-1 and 114-2 are separated from the first scan line SLn, the second scan line SLn−1, and the emission control line ELn and overlap with the channel areas of the active areas A1 of the driving TFTs T1 in floating electrode shapes. The first capacitor electrodes 114-1 and 114-2 are separated from each other between adjacent pixels to be formed in square shapes. The first scan line SLn operates as gate electrodes G2 of the switching TFTs T2 and gate electrodes G3 of the compensation TFTs T3. The second scan line SLn−1 operates as gate electrodes G4 of the initialization TFT T4. The emission control line ELn operates as gate electrodes G5 of the first emission control TFTs T5 and gate electrodes G6 of the second emission control TFTs T6.

Referring to FIGS. 7 and 9, a second gate insulating layer 103 is formed on the substrate 101 on which the first gate line are formed. The second gate insulating layer 103 operates a dielectric of a storage capacitor Cst. The second gate insulating layer 103 may be formed of an organic insulating material, an inorganic insulating material, or in a multilayer structure in which organic insulating materials alternate with inorganic insulating materials.

Second gate lines are formed on the second gate insulating layer 103. The second gate lines include second capacitor electrodes 116-1 and 116-2. The second gate lines may be formed of at least one metal material in the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and preferably, a low resistance metal material such as aluminum (Al), copper (Cu), or the like, like a material of the first gate line GL1.

The second capacitor electrodes 116-1 and 116-2 overlap with the first capacitor electrodes 114-1 and 114-2 to form the storage capacitor Cst. The second capacitor electrodes 116-1 and 116-2 are separated from each other between adjacent pixels sharing an initialization voltage VINT and having symmetrical structures, and each are connected to the second capacitor electrodes of adjacent pixels not sharing an initialization voltage VINT. Or the second capacitor electrodes 116-1 and 116-2 may be separated from each other in floating electrode shapes. The second capacitor electrodes 116-1 and 116-2 include storage openings 115. The storage openings 115 may have closed curve shapes. Here, a closed curve refers to a figure in which when one dot is marked on a straight line or a curve, start and end dots are closed like a polygon or a circle. The second capacitor electrodes 116-1 and 116-2 including the storage openings 115 may have doughnut shapes. Although an overlay deviation occurs between the first capacitor electrodes 114-1 and 114-2 and the second capacitor electrodes 116-1 and 116-2 in the manufacturing process of the display device, the capacitance of the storage capacitor Cst may be maintained as constant due to the shapes of the second capacitor electrodes 116-1 and 116-2. The overlay deviation refers to a difference between two or more overlapping layers which are shifted in up, down, left, and right directions and thus become different from their initial designed states. The overlay deviation may occur due to a misalignment between a substrate and a mask or a misalignment between the substrate and an exposure when a conductive layer is formed on a whole surface of the substrate and then patterned through a photolithography. It is likely that the overlay deviation will occur within an error range of a process apparatus in a system for making large panels and simultaneously producing a mass of panels. Even if the first capacitor electrodes 114-1 and 114-2 are shifted in up, down, left, and right directions, the second capacitor electrodes 116-1 and 116-2 overlap completely with the first capacitor electrodes 114-1 and 114-2, and the storage openings 115 of the second capacitor electrodes 116-1 and 116-2 constantly overlap with the first capacitor electrodes 114-1 and 114-2 at all times. Therefore, capacitance is kept constant.

Referring to FIGS. 8 and 9, an interlayer insulating layer 104 is formed on the substrate 101 on which the second gate lines are formed. Like the first and second gate insulating layers 102 and 103, the interlayer insulating layer 104 may be formed of an organic insulating material, an inorganic insulating material, or in a multilayer structure in which organic insulating materials alternate with inorganic insulating layers.

First contact holes Cnt1 are formed in the second gate insulating layer 103 and the interlayer insulating layer 104 through the openings 115 of the second capacitor electrodes 116-1 and 116-2 to expose the first capacitor electrodes 114-1 and 114-2. Third contact holes Cnt3 are formed in the interlayer insulating layer 104 to expose the second capacitor electrodes 116-1 and 116-2. Second contact holes Cnt2 are formed in the first and second gate insulating layers 102 and 103 and the interlayer insulating layer 104 to expose drain areas of the active layers A3 of the compensation TFTs T3 and drain areas of the active layers A4 of the initialization TFTs T4. Fourth contact holes Cnt4 are formed in the first and second gate insulating layers 102 and 103 and the interlayer insulating layer 104 to expose source areas of the active layers A2 of the switching TFTs T2. Fifth contact holes Cnt5 are formed in the first and second gate insulating layers 102 and 103 and the interlayer insulating layer 104 to expose the active layers A5 of the first emission control TFTs T5. Sixth contact holes Cnt6 are formed in the first gate insulating layers 102 and 103 and the interlayer insulating layer 104 to expose the active layers A6 of the second emission control TFTs T6. Seventh contact holes Cnt7 are formed in the first and second gate insulating layers 102 and 103 and the interlayer insulating layer 104 to expose an active area connection in which the first active layer 112-1 of the first pixel PX1 and the second active layer 112-2 of the second pixel PX2 are connected to each other.

First contact metals CM1 are formed on the interlayer insulating layer 104 to cover data signal lines DLm−1 and DLm, the driving voltage line PL in a vertical direction, the connection line 118, a connection line 120 connecting the first and second contact holes Cnt1 and Cnt2, and the sixth contact holes Cnt6. Second contact metals CM2 are formed on the interlayer insulating layer 104 to cover the seventh contact holes Cnt7.

The data signal lines DLm−1 and DLm are disposed at a side edge of every one pixel in the vertical direction. The data signal lines DLm−1 and DLm are connected to the switching TFTs T2 through the fourth contact holes Cnt4.

The driving voltage lines PL include the vertical driving voltage line PLV in the vertical direction and the horizontal driving voltage line PLH formed by the connection line 118 in a horizontal direction. One vertical driving voltage lines PLV is disposed at a side edge of every one pixel in the vertical direction to be adjacent to the data signal lines DLm−1 and DLm. Two vertical driving voltage lines PLV face each other between the first and second pixels PX1 and PX2. The connection line 118 crosses the first and second pixels PX1 and PX2 in the horizontal direction and connects the vertical driving voltage lines PLV of the first and second pixels PX1 and PX2 to operate as the horizontal driving voltage line PLH. Therefore, a mesh structure of the driving voltage lines PL is realized. The driving voltage lines PL are connected to the second capacitor electrodes 116-1 and 116-2 through the third contact holes Cnt3.

The connection line 120 connects the first capacitor electrodes 114-1 and 114-2, the compensation TFTs T3, and the initialization TFTs T4.

The data signal lines DLm−1 and DLm, the driving voltage lines PL including the connection line 118, the connection line 120, the first contact metals CM1, and the second contact metals CM2 may be formed of the same material on the same layer.

A protective layer 105 is formed on the substrate 101 on which the data signal lines DLm−1 and DLm, the driving voltage lines PL including the connection line 118, the connection line 120, the first contact metals CM1, and the second contact metals CM2 are formed. First and second via holes VH1 and VH2 are formed in the protective layer 105 to expose parts of the first and second contact metals CM1 and CM2.

The second via hole VH2 is commonly formed in the two adjacent first and second pixels PX1 and PX2 to improve an aperture of the two adjacent first and second pixels PX1 and PX2 more than when the second via hole VH2 is formed in each pixels first and second PX1 and PX2.

Figure 10:
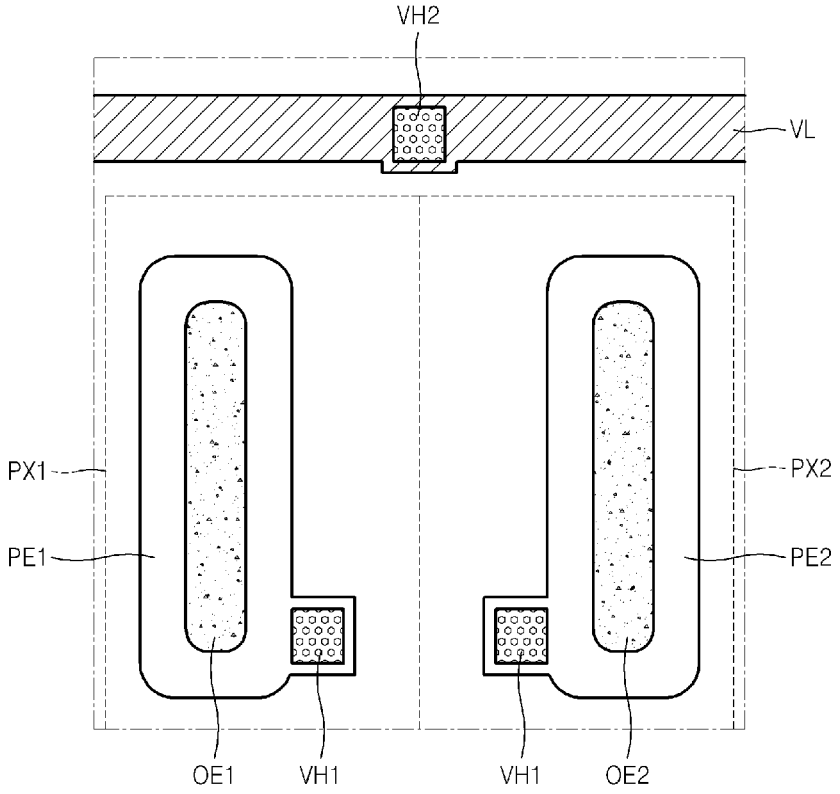

Referring to FIG. 10, pixel electrodes PE1 and PE2 and the initialization voltage line VL are formed on the protective layer 105. The pixel electrodes PE1 and PE2 are respectively connected to the second emission control TFTs T6 through the first vial holes VH1. The initialization voltage line VL is connected to the initialization TFTs T4 of the first and second pixels PX1 and PX2 through the second via hole VH2 commonly formed in the first and second pixels PX1 and PX2 in order to simultaneously transmit an initialization voltage VINT to the first and second pixels PX1 and PX2. The initialization voltage line VL may be formed of the same material as the pixel electrodes PE1 and PE2 on the same layer.

Although not shown, a pixel-defining layer (PDL) is formed on edges of the pixel electrodes PE1 and PE2 and the protective layer 105 and has a pixel opening exposing the pixel electrodes PE1 and PE2. The PDL may be formed of an organic material such as polyacrylate resin and polyimides or a silica-based inorganic material. Organic layers OE1 and OE2 and opposing electrodes (not shown) are formed on the pixel electrodes PE1 and PE2 exposed through the pixel opening. Here, the opposing electrodes cover the organic layers OE1 and OE2 and are formed on a whole surface of the substrate 101. Therefore, OLEDs of the first and second pixels PX1 and PX2, including the pixel electrodes PE1 and PE2, the organic layers OE1 and OE2 disposed on the pixel electrodes PE1 and PE2, and opposing electrodes covering the organic layers OE1 and OE2 and formed on the whole surface of the substrate 101, are formed.

If the display device has a front emission type structure, the pixel electrodes PE1 and PE2 may be included as reflective electrodes, and the opposing electrodes may be included as transmissive electrodes. In this case, the opposing electrodes may include transflective layers formed of Mg, Al, Pt, Pd, Au, Ni, Nd, Ir, Cr, Li, Ca, or the like or transmissive metal oxides such as ITO, IZO, ZnO, or the like. If the display device has a bottom emission type structure, Ag, Mg, Al, Pt, Pd, Au, Ni, Nd, Ir, Cr, Li, Ca, or the like may be deposited so that the opposing electrodes have reflective functions. If the pixel electrodes PE1 and PE2 are used as anode electrodes, the pixel electrodes PE1 and PE2 may include layers formed of a metal oxide such as ITO, IZO, ZnO, or the like having a high work function (an absolute value). If the pixel electrodes PE1 and PE2 are used as cathode electrodes, the pixel electrodes PE1 and PE2 may use high conductive metals having low work functions (absolute values) such as Ag, Mg, Al, Pt, Pd, Au, Ni, Nd, Ir, Cr, Li, Ca, or the like. If the pixel electrodes PE1 and PE2 are used as anode electrodes, the opposing electrodes are used as cathode electrodes. If the pixel electrodes PE1 and PE2 are used as cathode electrodes, the opposing electrodes are used as anode electrodes.

One or more functional layers, such as emissive layers (EMLs), hole transport layers (HTLs), hole injection layers (HILs), electron transport layers (ETLs), and electron injection layers (EILs), may be stacked in a single or multilayer structure to form the organic layers OE1 and OE2 of the first and second pixels PX1 and PX2. The organic layers OE1 and OE2 may be low or high molecular organic materials. If the organic layers OE1 OE2 emit R, G, and B lights, the EMLs may be patterned as R, G, and B emissive layers according to R, G, and B sub-pixels. If the organic layers OE1 and OE2 emit white light, the EMLs may have multilayer structures in which R, G, and B emissive layers are stacked, or single layer structures including R, G and B emissive materials to emit white light.

Figure 11:
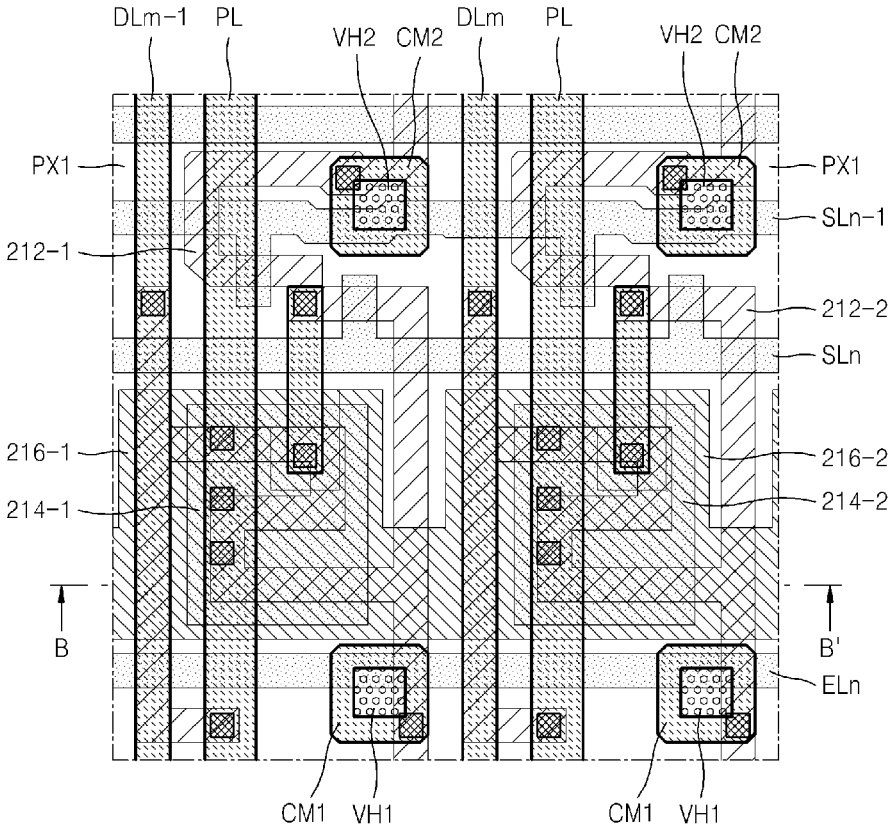
FIGS. 11 through 13 are views illustrating a comparison example with respect to the disclosed technology.
Figure 12:
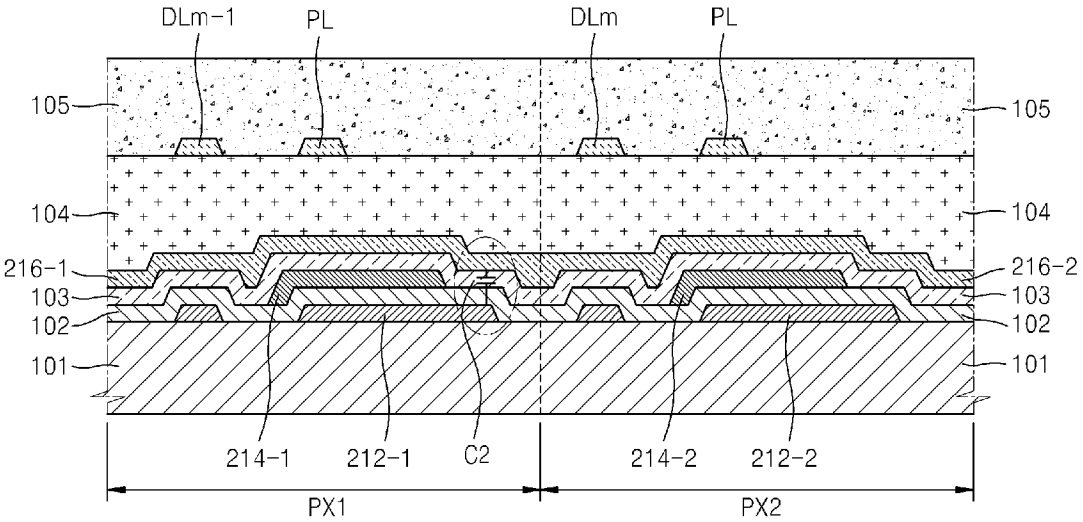
Figure 13:
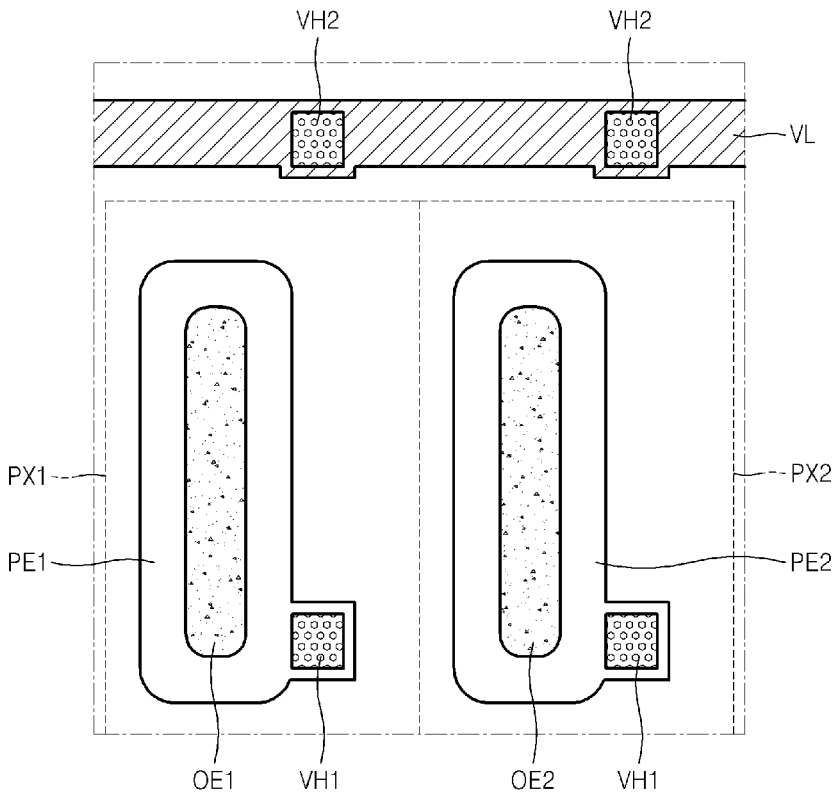

FIGS. 11 through 13 are views illustrating a comparison example with respect to the disclosed technology. FIG. 12 is a cross-sectional view taken along line B-B' of FIG. 11.

Referring to FIGS. 11 through 13, an active layer 212-1 of a first pixel PX1 and an active layer 212-2 of a second pixel PX2 are formed separately on a substrate 101. A first gate insulating layer 102, a first gate lines, a second gate insulating layer 103, a second gate lines, and an interlayer insulating layer 104 are sequentially formed on the active layers 212-1 and 212-2. The first gate lines include a first scan line SLn, a second scan line SLn−1, an emission control line ELn, and first capacitor electrodes 214-1 and 214-2. The second gate lines include second capacitor electrodes 216-1 and 216-2. The second capacitor electrode 216-1 of the first pixel PX1 and the second capacitor electrode 216-2 of the second pixel PX2 are connected to each other.

Data signal lines DL and driving voltage lines PL are formed on the interlayer insulating layer 104. The second capacitor electrodes 216-1 and 216-2 of the first and second pixels PX1 and PX2 are connected to the driving voltage lines PL through contact holes and thus operate to realize a mesh structure of the driving voltage lines PL. First and second contact metals CM1 and CM2 are formed on the interlayer insulating layer 104.

A protective layer 105 is formed on the substrate 101 on which the data signal lines DLm−1 and DLm, the driving voltage lines PL, the first contact metals CM1, and the second contact metals CM2 are formed. First and second via holes VH1 and VH2 are formed in the protective layer 105 of the first and second pixels PX1 and PX2 to expose parts of the first and second contact metals CM1 and CM2.

Pixel electrodes PE1 and PE2 and an initialization voltage line VL are formed on the protective layer 105. The pixel electrodes PE1 and PE2 are connected to second emission control TFTs T6 of the first and second pixels PX1 and PX2 through the first via holes vH1. The initialization voltage line VL is connected to initialization TFTs T4 of the first and second pixels PX1 and PX2 through the second via holes VH2 formed in the each first and second pixels PX1 and PX2.

As described with reference to FIG. 9, in certain embodiments, driving voltage lines PL having a mesh structure including vertical driving voltage lines PLV and horizontal driving voltage lines PLH may be formed of the same material on the same layer. Therefore, the first gate insulating layer 102, the second gate insulating layer 103, and the interlayer insulating layer 104 are formed between the connection line 118 constituting the horizontal driving voltage lines PLH and the first and second active layers 112-1 and 112-2 formed to be approximately orthogonal to the connection line 118.

In the comparison example of FIG. 12, the driving voltage lines PL having the mesh structure are formed of the second capacitor electrodes 216-1 and 216-2. Therefore, the first gate insulating layer 102 and the second gate insulating layer 103 are formed between a connection part of the second capacitor electrodes 216-1 and 216-2 and the active layers 212-1 and 212-2.

In a comparison between FIGS. 9 and 12, a capacitance of a parasitic capacitor C1 occurring between the driving voltage lines PL and the first and second active layers 112-1 and 112-2 according to certain embodiments of the disclosed technology is smaller than a capacitance of a parasitic capacitor C2 occurring between the driving voltage lines PL and the active layers 212-1 and 212-2 in the comparison example.

A parasitic capacitor occurring between the driving voltage lines PL having the mesh structure and active layers increase a leakage current flowing in pixel electrodes of OLEDs through the second emission control TFTs T6, thereby increasing a black luminance.

The horizontal driving voltage lines PLH are formed on the same layer on which the vertical driving voltage lines PLV are formed on the same layer as the data signal lines DLm−1 and DLm to form a thicker insulating layer between the driving voltages PL and the first and second active layers 112-1 and 112-2 in the embodiment of the disclosed technology than in the comparison example. Therefore, a parasitic capacitor of the driving voltage lines PL is reduced to prevent the black luminance from increasing, thereby reducing an image distortion of a screen.

Also, in certain embodiments of the disclosed technology, the driving voltage lines PL are formed in the mesh structure to supply a first power supply voltage ELVDD having a predetermined and constant intensity to thereby reduce voltage drop.

According to the above-described embodiments, an active matrix (AM) type organic light-emitting display device having a 6Tr-1Cap structure includes six TFTs and one capacitor in one pixel. However, the disclosed technology is not limited thereto, and a display device may include a plurality of TFTs and capacitors in one pixel. Also, an additional line may be further formed or an existing line may be omitted so that the display device has various structures.

As described above, a display device according to embodiments of the disclosed technology a voltage drop due to an increase in a size of a panel can be compensated.

Also, various embodiments of the display device minimize a parasitic capacitance to prevent increasing a black luminance.

While the disclosed technology has been particularly shown and described with reference to exemplary embodiments thereof, it will be understood by those of ordinary skill in the art that various changes in form and details may be made therein without departing from the spirit and scope of the disclosed technology as defined by the following claims.

What is claimed is:

[1. An organic light-emitting display device comprising:

a first pixel having a first active layer and a second pixel having a second active layer, the first pixel and the second pixel formed as two adjacent pixels in a row of pixels;

a connection area between the first pixel and the second pixel, the connection area including direct, physical contact between the first active layer and the second active layer;

at least one insulating layer formed on the first active layer and the second active layer;

a contact hole which is formed in the insulating layer and exposes the connection area;

a driving voltage line which is formed on the insulating layer;

a contact metal which is formed on the insulating layer and contacts the connection area through the contact hole;

a protective layer which is formed on the driving voltage line and the contact metal;

a via hole which is formed in the protective layer and exposes part of the contact metal; and an initialization voltage line which is connected to the contact metal to electrically connect to the first active layer and the second active layer through the via hole.]

[2. The organic light-emitting display device of claim 1, wherein the driving voltage line for the two adjacent pixels comprises two first voltage lines formed in a vertical direction and a second voltage line that is connected to the two first voltage lines in a horizontal direction.]

[3. The organic light-emitting display device of claim 2, wherein the two first voltage lines are spaced a distance apart from each other so as to parallel each other.]

[4. The organic light-emitting display device of claim 1, wherein the driving voltage line is formed on a layer on which a plurality of data signal lines are formed.]

[5. The organic light-emitting display device of claim 2, wherein the initialization voltage line is disposed to be parallel with the second voltage line.]

[6. The organic light-emitting display device of claim 1, wherein the initialization voltage line is formed on a layer on which pixel electrodes are formed.]

[7. The organic light-emitting display device of claim 1, wherein the first active layer and the second active layer are symmetrical based on the connection area.]

[8. The organic light-emitting display device of claim 2, wherein parts of the first and second active layers are formed to be orthogonal to the second voltage line and overlap with the second voltage line.]

[9. A method of manufacturing an organic light-emitting display device, the method comprising:

forming a first active layer a first pixel and a second active layer for a second pixel, the first and second pixels formed as two adjacent pixels in a row of pixels on a substrate, the first and second active layers having a connection area between the first and second pixels, the connection area including direct, physical contact between the first active layer and the second active law;

forming at least one insulating layer on the first and second active layers;

forming a contact hole in the insulating layer to expose a part of the connection area;

forming a contact metal and a driving voltage line on the insulating layer, wherein the contact metal contacts the connection area through the contact hole;

forming a protective layer on the driving voltage line and the contact metal;

forming a via hole in the protective layer to expose part of the contact metal; and forming an initialization voltage line that is connected to the contact metal to electrically connect to the first and second active layers through the via hole.]

[10. The method of claim 9, wherein the driving voltage line for the first and second pixels comprises two first voltage lines formed in a vertical direction and a second voltage line that is connected to the two first voltage lines in a horizontal direction.]

[11. The method of claim 10, wherein the initialization voltage line is formed to be parallel with the second voltage line.]

[12. The method of claim 10, wherein the first and second active layers are symmetrical based on the connection area, and parts of the first and second active layers are disposed to be orthogonal to the second voltage line and overlap with the second voltage line.]

*13. An organic light-emitting display apparatus comprising:*

*a first pixel;*

*a second pixel adjacent to the first pixel, the first pixel and the second pixel arranged in a same row and having respective first and second active layers;*

*a connection area between the first pixel and the second pixel, the connection area including direct, physical contact between the first active layer and the second active layer;*

*an insulating layer disposed on the first and second active layers;*

*a first data line extending in a first direction and providing data signal to the first pixel;*

*a second data line extending in the first direction and providing data signal to the second pixel;*

*a first driving voltage line disposed on the insulating layer, the first driving voltage line is parallel to the first data line;*

*a second driving voltage line disposed on the insulating layer, the second driving voltage line is parallel to the second data line; and*

*a third driving voltage line disposed on the insulating layer, the third driving voltage line connecting the first driving voltage line and the second driving voltage line,*

*an initialization voltage line which is connected to the first active laver and the second active layer,*

*wherein each of the first pixel and the second pixel comprises a driving transistor and a capacitor overlapping the driving transistor,*

*wherein the capacitor comprises a first electrode layer and a second electrode layer overlapping the first electrode layer and having an opening, and*

*wherein the second electrode layer of the capacitor of the first pixel and the second electrode layer of the capacitor of the second pixel are spaced apart from each other.*

*14. The organic light-emitting display apparatus of claim 13, wherein the first driving voltage line, the second driving voltage line and the third driving voltage line form a single body.*

*15. The organic light-emitting display apparatus of claim 13, wherein the first driving voltage line, the second driving voltage line and the third driving voltage line are separate conducting lines.*

*16. The organic light-emitting display apparatus of claim 13, wherein a part of the second electrode layer of the capacitor of the first pixel is overlapped with the first data line, and*

*wherein a part of the second electrode layer of the capacitor of the second pixel is overlapped with the second data line.*

*17. The organic light-emitting display apparatus of claim 13, wherein the second electrode layer of the capacitor of the first pixel is electrically connected to the first driving voltage line, and*

*wherein the second electrode layer of the capacitor of the second pixel is electrically connected to the second driving voltage line.*

*18. The organic light-emitting display apparatus of claim 13, wherein the driving transistor of the first pixel comprises a gate electrode and an active laver that has a curved shape.*

*19. The organic light-emitting display apparatus of claim 18, wherein the driving transistor of the second pixel comprises a gate electrode and an active layer that has a curved shape.*

*20. The organic light-emitting display apparatus of claim 18, wherein the first pixel further comprises:*

*a first transistor connected between the driving transistor of the first pixel and the first data line, and*

*a second transistor connected between the gate electrode and the active layer of the driving transistor of the first pixel.*

*21. The organic light-emitting display apparatus of claim 20, wherein the first pixel further comprises a first connection line connecting the first electrode layer of the capacitor and the second transistor through the opening of the second electrode layer of the capacitor.*

*22. The organic light-emitting display apparatus of claim 21, wherein the first connection line and the first data line are on a same layer.*

*23. The organic light-emitting display apparatus of claim 20, wherein the first pixel further comprises a third transitor comprising an active layer connected between the gate electrode of the driving transistor and an initialization line, and*

*wherein the active layer of the third transistor has a curved shape and overlaps twice with a first signal line.*

*24. The organic light-emitting display apparatus of claim 23, wherein the first signal line is extending in a second direction perpendicular to the first direction.*

*25. The organic light-emitting display apparatus of claim 23, wherein the first pixel further comprises a second connection line connecting the active layer of the third transistor and initialization line.*

*26. The organic light-emitting display apparatus of claim 25, wherein the second connection line and the first data line are on a same layer.*

*27. The organic light-emitting display apparatus of claim 20, wherein the active layer of the second transistor has a curved shape and overlaps twice with a second signal line.*

*28. The organic light-emitting display apparatus of claim 27, wherein the second signal line is extending in a second direction perpendicular to the first direction.*

*29. The organic light-emitting display apparatus of claim 13, wherein the first data line and the first driving voltage line are on a same layer.*

*30. The organic light-emitting display apparatus of claim 13, wherein the first driving voltage line overlaps a part of each of the first electrode layer and the second electrode layer of the capacitor.*

* * * * *